(12) United States Patent  (10) Patent No.: US 12,204,819 B2
Lilien  (45) Date of Patent: Jan. 21, 2025

(54) TECHNOLOGIES FOR MEASURING AND ANALYZING ROADWAY OR PATHWAY LIGHTING DATA

(71) Applicant: UL LLC, Northbrook, IL (US)

(72) Inventor: Adam Lilien, Syracuse, NY (US)

(73) Assignee: UL LLC, Northbrook, IL (US)

( * ) Notice: Subject to any disclaimer, the term of this patent is extended or adjusted under 35 U.S.C. 154(b) by 0 days.

(21) Appl. No.: 17/719,219

(22) Filed: Apr. 12, 2022

(65) Prior Publication Data
US 2022/0327250 A1 Oct. 13, 2022

Related U.S. Application Data

(60) Provisional application No. 63/174,203, filed on Apr. 13, 2021.

(51) Int. Cl.
G06F 30/12 (2020.01)
G06Q 50/26 (2012.01)

(52) U.S. Cl.
CPC ........... *G06F 30/12* (2020.01); *G06Q 50/265* (2013.01)

(58) Field of Classification Search
CPC .............................. G06Q 50/265; G06F 30/12
See application file for complete search history.

(56) References Cited

U.S. PATENT DOCUMENTS

| 8,928,662 | B2 * | 1/2015 | Gordin | G06T 15/50 |
| | | | | 345/426 |
| 2006/0022808 | A1 * | 2/2006 | Ito | G08G 1/167 |
| | | | | 340/576 |
| 2007/0263222 | A1 * | 11/2007 | Loveless | G01J 1/08 |
| | | | | 356/445 |
| 2010/0202140 | A1 * | 8/2010 | Rooymans | F21V 7/09 |
| | | | | 362/231 |
| 2012/0040606 | A1 | 2/2012 | Verfuerth | |

(Continued)

FOREIGN PATENT DOCUMENTS

KR 2013-0075052 A 7/2013

OTHER PUBLICATIONS

Kaufman, Andrew. Shedding light on GIS: A 3D immersive approach to urban lightscape integration into GIS. West Virginia University, 2014.*

(Continued)

*Primary Examiner* — Nithya J. Moll
(74) *Attorney, Agent, or Firm* — MARSHALL, GERSTEIN & BORUN LLP

(57) ABSTRACT

Systems and methods for detecting roadway and/or pathway lighting conditions are disclosed. According to certain aspects, various devices or sensors may collect a set of lighting measurements respectively at a set of locations along a roadway and/or pathway, and capture scanning data indicative of a set of surroundings located along the roadway and/or pathway. Further, an electronic device may analyze the scanning data to classify a set of light poles along the roadway and/or pathway as well as associate the set of lighting measurements with the set of locations. Moreover, the electronic device may generate an electronic file indicating the set of lighting measurements associated with the set of locations and the set of light poles classified at the portion of the set of locations.

12 Claims, 10 Drawing Sheets

(56) References Cited

U.S. PATENT DOCUMENTS

2018/0115751 A1 4/2018 Noone

OTHER PUBLICATIONS

Kurkela, Matti, et al. "Camera preparation and performance for 3D luminance mapping of road environments." Photogramm. J. Finland 25.2 (2017): 1-23.*
Navvab, Mojtaba, Fabio Bisegna, and Franco Gugliermetti. "Dynamic roadways and in-vehicle lighting conditions for determining mesopic adaptation luminance." 2015 IEEE 15th International Conference on Environment and Electrical Engineering (EEEIC). IEEE, 2015.*
Chuang, Chia-Yuan. Lighting Prediction and Simulation in Large Nighttime Urban Scenes. Arizona State University, 2011.*
Johnson, Mathew, et al. "Embedded System Design of an Advanced Illumination Measurement System for Highways."*
International Application No. PCT/US2022/024329, International Search Report and Written Opinion, mailed Jul. 19, 2022.
SaskPower Standard Engineering Practice Section 4, Roadway Lighting Design Guide, 57 pp. (Nov. 6, 2017).
Yan et al., Automatic extraction of highway light poles and towers from mobile LiDAR data, Optics & Laser Technology, 14 pp. (Sep. 2015).

\* cited by examiner

TECHNOLOGIES FOR MEASURING AND ANALYZING ROADWAY OR PATHWAY LIGHTING DATA

CROSS-REFERENCE TO RELATED APPLICATIONS

This application claims priority benefit to U.S. Patent Application No. 63/174,203, filed Apr. 13, 2021, which is hereby expressly incorporated by reference in its entirety.

FIELD

The present disclosure is directed to collecting, analyzing, and simulating lighting data associated with roadways and/or pathways. More particularly, the present disclosure is directed to platforms and technologies for collecting data associated with the lighting and surroundings of roadways and/or pathways, analyzing the data to assess lighting conditions, and generating electronic visualizations of the same for access and simulations by users.

BACKGROUND

Street lighting, which generally constitutes lighting that illuminates roadways and/or pathways, is typically designed to improve motorist visual quality, provide quality light and increased contrast for noticing hazards, illuminate conflict areas, and minimize environmental impacts of light at night, among other purposes, while employing systems that are easily maintained and minimize energy use. With the advent of LED lighting, upgrades from glass and filament lamps have been paid for by the energy savings provided by the LED lighting. While most roadway and/or pathway lighting projects are successful, others do not meet requisite standards due to, for example, the inability of procurement officers in municipalities to discern between a quality product and one from an unknown manufacturer with little to no history in the industry and/or questionable practices.

Some countries have passed legislation that requires certain lighting projects to be audited to ensure that the quality (i.e., light output) meets standards. Traditional auditing techniques require field engineers to close down a street and conduct rather laborious measurements, while only a small percentage of the roads can be measured in this way. Additionally, certain lighting projects suffer from inefficient light poles and luminaires associated therewith, and/or lack of quality luminaires or other fixture components, however it is difficult to ascertain these shortcomings. Moreover, any mechanisms or techniques for diagnosing and addressing issues with lighting systems is manual and cumbersome.

Accordingly, there are opportunities for systems and methods to collect and compile data associated with conditions of a lighting system along a roadway(s) and/or a pathway(s), analyze that data to determine areas for improvement, and enable an individual to assess the lighting conditions and improvements therefor, and facilitate those improvements.

SUMMARY

In an embodiment, a computer-implemented method for detecting roadway or pathway lighting conditions is provided. The method may include: collecting, by a meter device, a set of lighting measurements respectively at a set of locations along a roadway or pathway; capturing, by a detector device, scanning data indicative of a set of surroundings located along the roadway or pathway; analyzing, by a processor, the scanning data to classify a set of light poles respectively located at a portion of the set of locations along the roadway or pathway; associating, by the processor, the set of lighting measurements with the set of locations at which the set of lighting measurements was collected; and generating, by the processor, an electronic file indicating (i) the set of lighting measurements associated with the set of locations, and (ii) the set of light poles classified at the portion of the set of locations. According to embodiments, the meter device may be a lidar sensor that may generate sensor data from which point cloud data may be generated.

In another embodiment, a system to detect roadway or pathway lighting conditions is provided. The system may include: a meter device configured to collect a set of lighting measurements; a detector device configured to capture scanning data; and a processor configured to: access the set of lighting measurements collected by the meter device, the set of lighting measurements respectively collected at a set of locations along a roadway or pathway, access the scanning data captured by the detector device, the scanning data indicative of a set of surroundings located along the roadway or pathway, analyze the scanning data to classify a set of light poles respectively located at a portion of the set of locations along the roadway or pathway, associate the set of lighting measurements with the set of locations at which the set of lighting measurements was collected, and generate an electronic file indicating (i) the set of lighting measurements associated with the set of locations, and (ii) the set of light poles classified at the portion of the set of locations.

DETAILED DESCRIPTION

Figure 1:
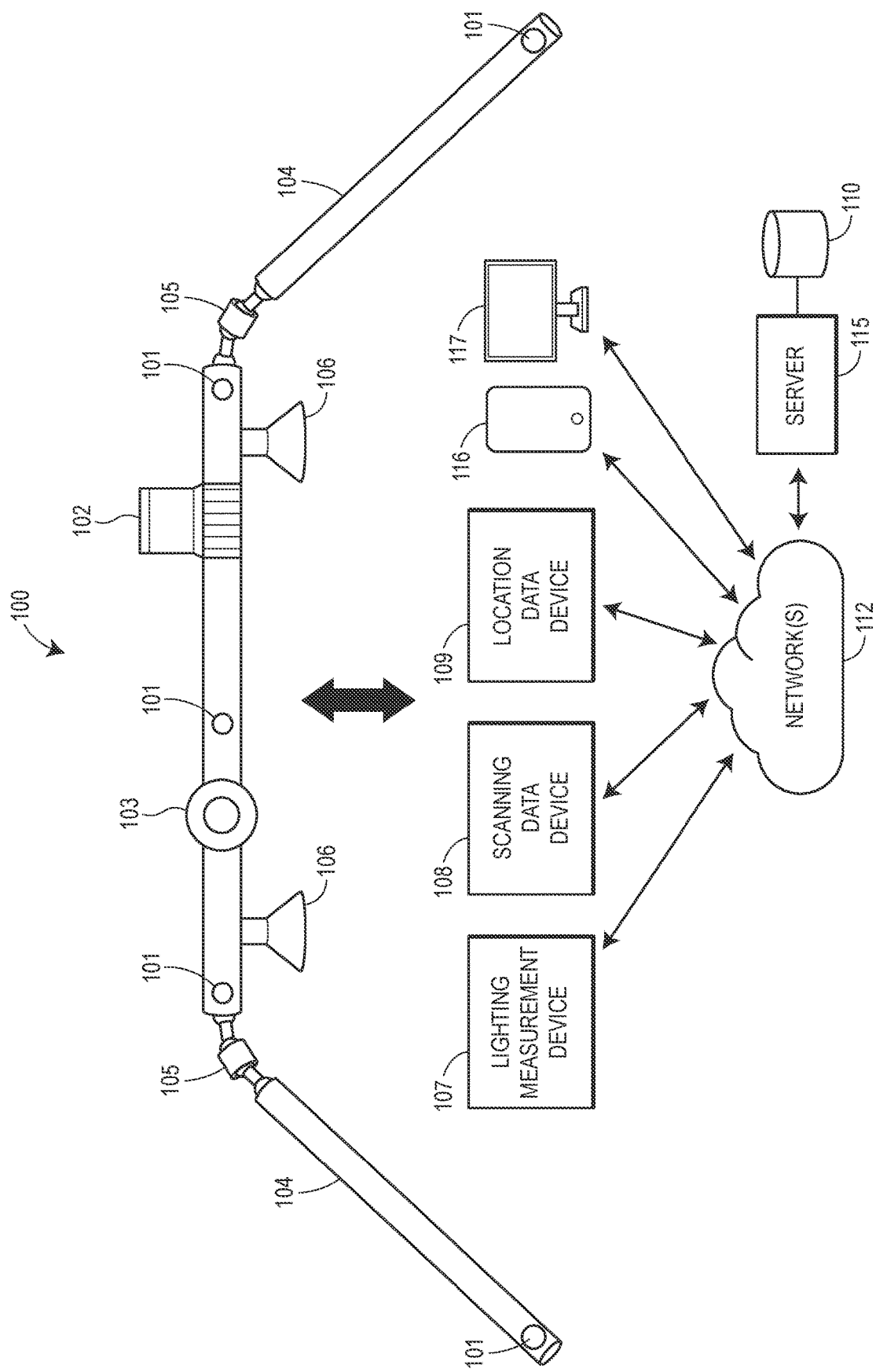
FIG. 1 depicts an overview of components and entities configured to facilitate the described functionalities, in accordance with some embodiments.

Generally, the Illumination Engineering Society (IES) has defined various goals of standards associated with roadway and/or pathway or street lighting: improve motorist visual quality, provide quality light and increased contrast for seeing hazards, illuminate conflict areas, minimize environmental impacts of light at night, and employ lighting systems that are easily maintained and minimize energy use. Similarly, the main purpose of roadway and/or pathway lighting is ensuring the safety of drivers, pedestrians, and cyclists by reducing accidents and fatalities, while enhancing safety through the potential reduction in crime, as well as enhancing and creating a pleasant environment.

Currently, specifiers and end-users of outdoor illumination systems are limited in being able to benchmark the quality and performance of their installed systems against specifications and manufacturer claims. Further, LED technology has challenged traditional pole-spacing needs, in some cases negatively impacting the quality of certain roadway and/or pathway and outdoor lighting systems. In the United States, roadway and/or pathway lighting systems are typically owned by federal government agencies, utilities, ESCOs, and municipalities. In other countries, there are various owners of street lights that largely reflect the same situation as the US.

Current lighting standards are well defined, where the overall quality of an installation has several components, including: average luminance level, which not only impinges on the safety benefits but also largely determines the power requirements and hence the running costs; overall uniformity of luminance, or illuminance, both across and along the roadway and/or pathway, which may be defined as the minimum divided by the average, and designated "U0"; uniformity of luminance, or illuminance, along the axis of the road, usually an axis which coincides with a typical driver's eye position, which may be defined as the ratio of the minimum to the maximum, and designated "U1"; the lighting of the area adjacent to the carriageway to illuminate any footpath or surroundings (e.g., considering two strips each five (5) meters wide (one in the road, the other alongside, where the illuminance on the off-road strip should be at least 50% of the other); glare—as glare has the effect of reducing contrast, a luminaire's "glare performance", or optical control, can be expressed in terms of the increase in background luminance necessary to compensate (threshold increment, TI), where the lower the figure, the better; guidance—while glare must be kept under control, a small amount of direct light from the luminaires gives a useful sense of the "run" of the road ahead, and can forewarn the approach of junctions or roundabouts.

Many municipal street lighting systems throughout the world are outdated, use inefficient technologies, and/or are poorly designed and maintained, resulting in high energy and maintenance costs that account for a significant portion of a municipality's operating budget. This is due to a number of reasons, including: the current requirement for governments to procure the lowest up-front cost products does not take into account the life-cycle cost, resulting in the purchase and use of older and less-efficient technologies; lack of knowledge, standards, testing facilities, and measurement equipment applicable to the new and energy-efficient light-emitting diode (LED) technology; lack of knowledge of best practices in street lighting installation, maintenance, and the measurement, reporting, and verification of lighting system performance; limited options for the financing and scale-up of street lighting programs; and a nascent market for LED technologies.

Additionally, several key players in the lighting market are impacted by the introduction of laws requiring roadway and/or pathway quality audits: lighting designers now have awareness that their designs will be measured in the field, and must perform to standards; highway/road owners have to ensure that their roads perform over time—road surface is normally their concern with lighting being secondary, however the new laws raise their awareness, and quality lighting on roadways and/or pathways can help to reduce accidents and minimize liability; lighting manufacturers have to build products that deliver the standards and still compete on price, as lowest price often wins; and authorities having jurisdiction have to review audits to ensure compliance with the new laws, as education is important.

Generally, there are two principal tasks for consideration by a roadway and/or pathway lighting designer or engineer. First, there is the choice of overall quality of the lighting: selection and positioning of the lamps and luminaires, and the position above the roadway and/or pathway to give the desired level, spread and uniformity of luminance. Tests to measure the overall uniformity or the lighting, in "lux" levels, is the primary test. Second, there is the reflectivity of the road. A lighting roadway and/or pathway takes less lumens to make pedestrians visible, and measures of reflectivity based on standards is the primary test. Both of these present challenges in the auditing of roadway and/or pathway illumination. At the same time, the designer intends to minimize the amount of glare from lighting directly entering the road user's eyes. While some roadways and/or pathways are being planned and built, a vast majority of roadways and/or pathways already exist, where light poles have been placed, and new light pole placement is generally not within scope. As lighting systems transition from HID to LED, it is common for a Watt-for-Watt swap out to be the first design consideration. For example, a 250 W HID should be replaced with a 100 W LED. However, this misses the fact that an HID luminaire is very different from an LED luminaire, and wattage is an inaccurate way of determining new fixture needs.

Measuring or auditing a roadway and/or pathway lighting system is a highly cumbersome process. In particular, shutting down a road so a team of field engineers with measuring equipment can take measurements is an impractical way to take hundreds or thousands of measurements, and is unsafe for the workers. Additionally, using conventional processes, only a few streets can be measured after a long planning process, obtaining permits, closing streets, and deploying engineers to take measurements at night.

The present embodiments as discussed herein address these challenges. In particular, the present embodiments may relate to, inter alia, platforms and technologies for effectively and efficiently capturing and analyzing data associated with lighting conditions along a set of roadways and/or pathways. According to certain aspects, the systems and methods may incorporate data capture components configured to capture relevant lighting condition data. In particular, the data capture components may include a meter device for collecting a set of lighting measurements along a roadway and/or pathway, and a detector device to capture scanning data indicative of a set of surroundings located along the roadway and/or pathway.

The systems and methods may analyze the collected and captured data to associate a set of locations with the collected and captured data. Further, the systems and methods may analyze the scanning data to classify a set of light poles located at certain locations along the roadway and/or pathway. Additionally, the systems and methods may generate an electronic file indicating the set of lighting measurements associated with the set of locations as well as the classified set of light poles. A computing device may enable a user to access the electronic file to review the data, simulate adjustments to the lighting systems, or otherwise determine potential improvements to the lighting systems. It should be appreciated that the terms "roadway" and "pathway", as referenced herein, may be interchangeable or may refer to separate elements (e.g., a roadway may be a road on which vehicles travel and a pathway may be a path on which pedestrians travel).

The systems and methods offer numerous benefits. In particular, the combination of the data that is captured provides an accurate and comprehensive assessment of lighting conditions at various locations along a roadway and/or pathway. Generally, the combination of data collection devices collect relevant data over a large length of roadways and/or pathways which is not possible using conventional techniques. Further, the data is analyzed which enables a user (e.g., a lighting designer or other individual such as an individual associated with a municipality) to review the analyzed data to assess areas having lighting conditions that do or do not meet certain goals or thresholds. The user is further able to virtually model changes in roadway and/or pathway conditions (e.g., different placements and configurations for light poles) that may improve the lighting conditions for the roadway and/or pathway. Any determined improvements may generally improve the lighting conditions along the roadway and/or pathway, leading to safer conditions for motorists and pedestrians, potentially save money for municipalities, and improve the aesthetic conditions for the lighting systems, among other benefits. Moreover, the systems and methods employ various machine learning techniques to improve the accuracy of various of the data analysis aspects. It should be appreciated that additional benefits are envisioned.

FIG. 1 illustrates an overview of a system 100 of components configured to facilitate the systems and methods. It should be appreciated that the system 100 is merely an example and that alternative or additional components are envisioned. Generally, the system 100 may be a "rack" device composed of a set of rods or poles 104 connected to each other via a set of joints 105. The system 100 may be configured to mount or attach to a vehicle or other type of movable object via a set of attachment mechanisms 106 such as a suction component, vacuum pump, or other mechanism. In an implementation, the system 100 may be attached to a portable component such as a backpack, thereby enabling an individual to access certain areas that may be inaccessible to vehicular traffic. The vehicle may operate on a roadway and/or pathway, and the components of the system 100 may capture respective data associated with lighting conditions of the roadway and/or pathway.

As illustrated in FIG. 1, the system 100 may include a set of meter devices 101, a detector device 102, and a location module 103. According to embodiments, each of the set of meter devices 101 may be a photo cell configured to measure a luminous flux per unit area ("lux") or generally a luminance level. Further, the detector device 102 may be one of a variety of imaging or scanning devices. In one implementation, the detector device 102 may be a lidar (or "LiDAR") device configured to determine ranges by targeting an object with a laser and measuring the time for the reflected light to return to the detector device 102. In another implementation, the detector device 102 may be a video or imaging device configured to capture a set of images and/or video. In certain embodiments, the system 100 may include both a lidar device and a video or imaging device. The location module 103 may generate global positioning system (GPS) data or other location data, such as over a period of time during which the set of meter devices 101 and the detector device 102 are generating and/or collecting respective data.

The various components of the system 100 may communicate with other devices that may be located within or remote from the vehicle. In particular, the other devices may include a lighting measurement device 107, a scanning data device 108, and a location data device 109. It should be appreciated that the lighting measurement device 107, the scanning data device 108, and the location data device 109 may be separate devices or may be incorporated into one or more devices. Additionally, it should be appreciated that the set of meter devices 101 may be incorporated within the lighting measurement device 107, the detector device 102 may be incorporated within the scanning data device 108, and the location module 103 may be incorporated within the location data device 109.

According to embodiments, the set of meter devices 101 may transmit collected or generated data to the lighting measurement device 107, the detector device 102 may transmit collected or generated data to the scanning data device 108, and the location module 103 may transmit collected or generated data to the location data device 109. The respective devices may communicate with each other via one or more different types of network connections, such as any type of wired or wireless connection including a local area network and/or a personal area network, such as a Bluetooth® network.

Each of the lighting measurement device 107, the scanning data device 108, and the location data device 109 may be communicatively connected to a server 115 via a network(s) 112, where the server 115 may be remote from the devices 107, 108, 109. In embodiments, the network(s) 112 may support any type of data communication via any standard or technology (e.g., GSM, CDMA, VoIP, TDMA, WCDMA, LTE, EDGE, OFDM, GPRS, EV-DO, UWB, Internet, IEEE 802 including Ethernet, WiMAX, Wi-Fi, Bluetooth, and others). The server 115 may be associated with an entity such as a company, business, corporation, or the like, and may interface with or support a memory or storage 110 capable of storing various data including any collected or generated data, such as in one or more databases or other forms of storage. In an implementation, each of the lighting measurement device 107, the scanning data device 108, and the location data device 109 may be communicatively connected to a database that is local to the devices 107, 108, 109 (not shown in FIG. 1).

The system 100 may further include a set of electronic devices 116, 117 which may also be communicatively connected to the server 115 via the network(s) 112. Each of the electronic devices 116, 117 may be any type of electronic device such as a mobile device (e.g., a smartphone), desktop computer, notebook computer, tablet, phablet, cloud computer, GPS (Global Positioning System) or GPS-enabled device, smart watch, smart glasses, smart bracelet, wearable electronic, PDA (personal digital assistant), pager, virtual reality (VR) headset, computing device configured for wireless communication, and/or the like.

In embodiments, each of the electronic devices 116, 117 may support a design application that may read, process, and analyze data recorded and compiled by the devices 107, 108, 109 and/or analyzed by the server 115. Further, in embodiments, a user(s) may operate the electronic devices 116, 117 (e.g., via the design application) to review various portions of the data. In particular, a user interface(s) of the electronic devices 116, 117 may present a visual rendering of roadway and/or pathway lighting conditions. The user(s) may select to add, remove, and modify certain aspects of lighting systems, where the electronic devices 116, 117 may update the visual rendering to reflect the added, removed, or modified aspects. Thus, the user(s) may review the presented information to assess deficiencies associated with and determine how to improve the lighting conditions associated with roadway and/or pathway lighting systems. Further, the user(s) may make selections associated with any analyzed data, which may form a training set of data to be used by the server 115 or the electronic devices 116, 117 to train a machine learning model.

Although depicted as a single database 110, a single server 115, and two (2) electronic devices 116, 117 in FIG. 1, it should be appreciated that different amounts of databases, servers, and electronic devices are envisioned.

Figure 2:
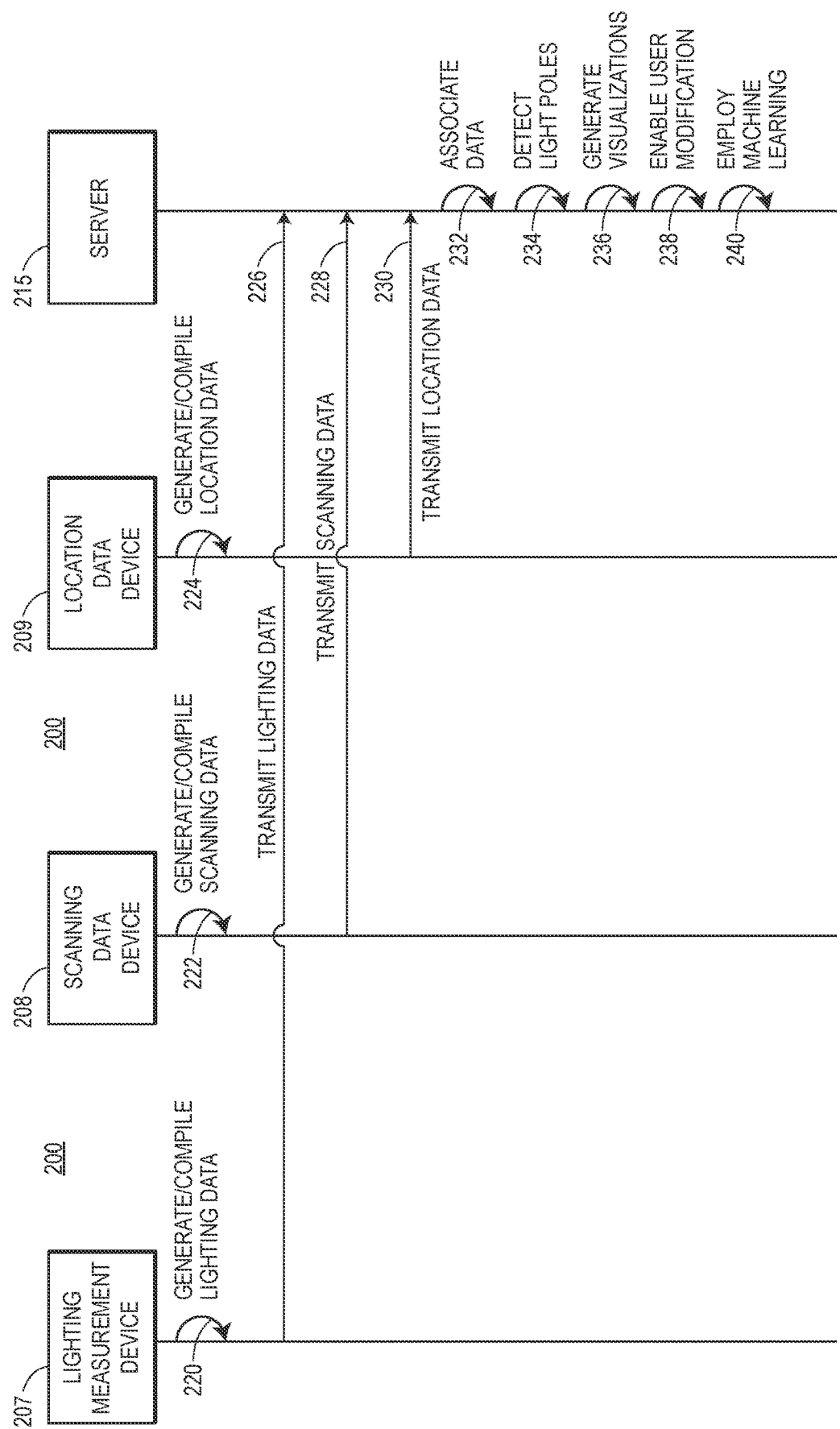
FIG. 2 depicts a flow diagram of various of the described functionalities performed by various devices, in accordance with some embodiments.

FIG. 2 illustrates a signal diagram 200 comprising a set of components and illustrating various functionalities that may be facilitated by the set of components. The signal diagram 200 includes a lighting measurement device 207 (such as the lighting measurement device 107 as discussed with respect to FIG. 1), a scanning data device 208 (such as the scanning data device 108 as discussed with respect to FIG. 1), a location data device 209 (such as the location data device 109 as discussed with respect to FIG. 1), and a server 215 (such as the server 115 as discussed with respect to FIG. 1).

Generally, the devices 207, 208, 209 may be configured to attach or mount to a vehicle (or interface with sensors attached or mounted to the vehicle), and capture/generate respective data as the vehicle travels on a roadway(s) and/or pathway(s). Further, the server 215 may be remote from the devices 207, 208, 209, and may communicate with the devices 207, 208, 209 via one or more communication networks. In embodiments, the functionalities performed by the server 215 may additionally or alternatively be performed by a device installed on or local to the vehicle, and/or performed by an electronic device such as the electronic devices 116, 117 as discussed with respect to FIG. 1.

The signal diagram 200 may begin with the lighting measurement device (207) generating and/or compiling (220) lighting data. According to embodiments, the lighting data may be in the form of lux measurements (or generally, luminance levels) that are generated at a set of locations along the roadway and/or pathway. Concurrently or separately, the scanning data device 208 may generate and/or compile (222) scanning data. According to embodiments, the scanning data may be a combination of two-dimensional and/or three-dimensional imaging data, including video data, lidar data, and/or the like, and the scanning data device 208 may also generate the scanning data at a set of locations along the roadway and/or pathway. Concurrently or separately, the location data device 209 may generate and/or compile (224) location data. According to embodiments, the location data may be GPS data or other similar data that the location data device 209 may also generate at a set of locations along the roadway and/or pathway. It should be appreciated that the devices 207, 208, 209 may generate/capture the respective data continuously, at predefined intervals, or in response to a trigger event.

The lighting measurement device 207 may transmit (226) the lighting data to the server 215; the scanning data device 208 may transmit (228) the scanning data to the server 215; and the location data device 209 may transmit (230) the location data to the server 215. According to embodiments, the devices 207, 208, 209 may transmit the respective data concurrently or separately, and may transmit the respective data as the respective data is generated/compiled, at predetermined times or intervals, or in response to another trigger. For example, the devices 207, 208, 209 may individually or collectively transmit the data to the server 215 via a network connection when the devices 207, 208, 209 detect the network connection to the server 215.

After the server 215 receives the data, the server 215 may associate (232) the data. In particular, the server 215 may associate each of the lighting data and the scanning data with the location data. Accordingly, each individual portion of the lighting data and the scanning data has associated a location at which that individual portion was generated. For example, a given lux measurement has associated a first location on a roadway and/or pathway at which that lux measurement was captured; and a given set of scanning data has associated a second location on the roadway and/or pathway at which that scanning data was captured.

The server 215 may analyze the scanning data to detect (234) a set of light poles that are positioned near the roadway and/or pathway. In implementations in which the scanning data is video data, the server 215 may analyze the video data and detect "bright" spots that may represent the light portions of light poles. In particular, the server 215 may compare one or more properties of a given bright spot (e.g., brightness) to a threshold value(s), and if the one or more properties at least meets the threshold value(s), the server 215 may classify the given bright spot as the light of a light pole.

Figure 3:
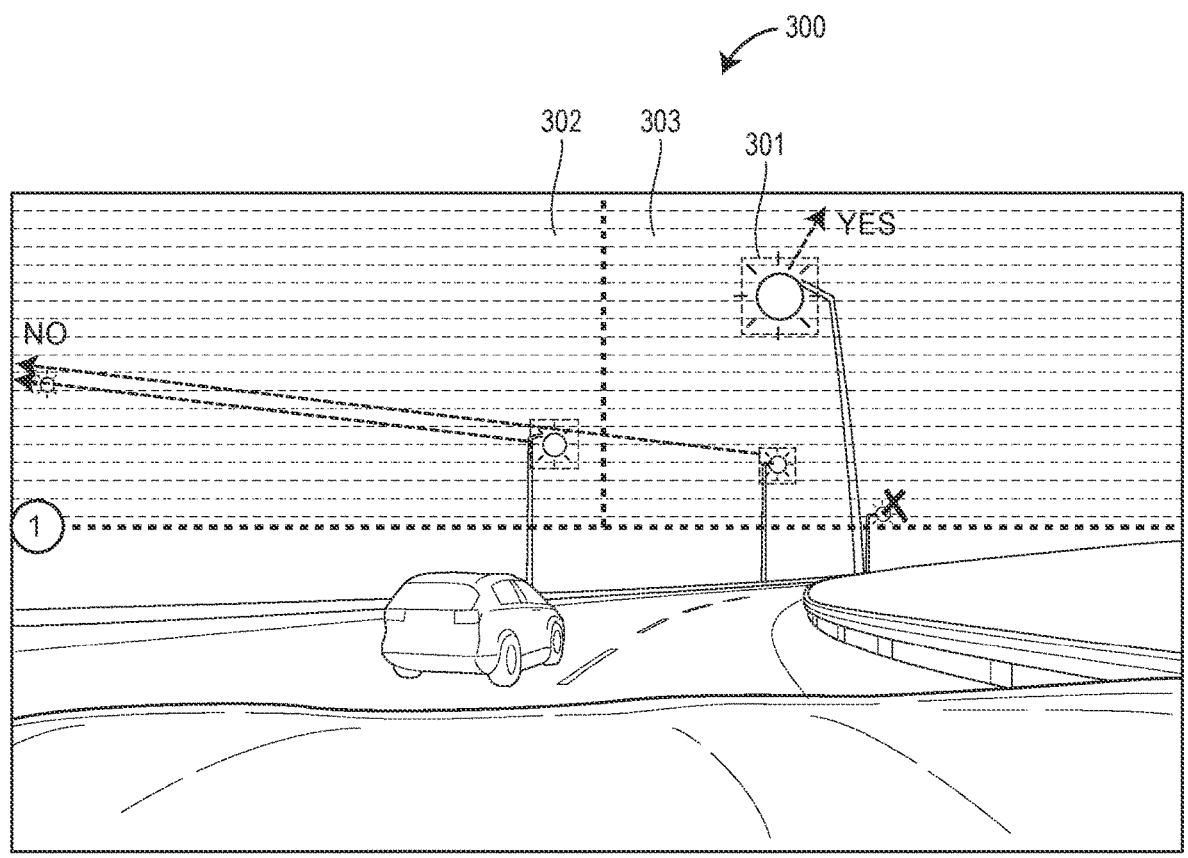
FIG. 3 depicts example image data used to identify light poles, in accordance with some embodiments.

The server 215 may also determine a direction in which a bright spot departs or exits relevant video data. FIG. 3 depicts an example image 300 from video data. A set of boxes 301, 302, 303 represent bright spots that are detected in the video data, where the server 215 may determine whether the bright spots are associated with light poles on the right side of the lane on which the vehicle is traveling.

In particular, the server may determine whether a bright spot departs the video data up and to the right (i.e., corresponding to a light pole on the right side of the lane), or to the left (i.e., corresponding to a light pole on the opposite side of the roadway and/or pathway; that is, on the side of the roadway and/or pathway on which opposite direction traffic is traveling). As depicted in FIG. 3, the box 301 corresponds to a light pole on the right side of the lane because it departs the video data up and to the right; and the boxes 302, 303 correspond to light poles on the opposite side of the roadway and/or pathway because they depart the video data to the left. If the server 215 detects a light pole for a lane on which the vehicle is traveling, the server 215 records the location for that light pole.

Additionally or alternatively, the server 215 may correlate a light pole with a lux level, as included in the lighting data, that at least meets a predefined threshold. When the server 215 detects a lux level that at least meets a predefined threshold, the server 215 may classify the corresponding location as having a light pole. Additionally, the server 215 may access a corresponding image corresponding to that location from the scanning/video data. Alternatively, the server 215 may cause the scanning data device 208 to capture an image at that location. In embodiments, a user may review, for example via a user interface of the server 215 or another electronic device, the image corresponding to that location, and may confirm that a light pole exists at the location or may override or remove the classification of the light pole.

The server 215 may additionally or alternatively employ one or more photogrammetry techniques to detect one or more light poles in the scanning data, such as if the scanning data is lidar data or another type of 3D modeling data.

Additionally or alternatively, the scanning data device 208 may be a lidar sensor. In operation, the lidar sensor may emit a set of pulses (e.g., as pulsed light waves) in its vicinity or surrounding environment. At least some of the set of pulses may bounce or reflect off of surrounding objects and return to the lidar sensor. In turn, the lidar sensor may detect the reflected set of pulses and record the elapsed time between emitting and detecting a given pulse. A processor associated with the scanning data device 208 (or the server 215) may use these individual elapsed times to calculate respective distances between the scanning data device 208 and the respective objects, and process the data set into a 3D visualization known as a "point cloud."

Because a lidar sensor(s) is capable of emitting a large amount of pulses (e.g., 2.6 million per second), a detailed point cloud may be generated. To detect light poles using lidar data, the server 215 may examine the lidar data, and detect and "extract" certain geometric shapes. For example, in the case of light poles, the server 215 may extract vertical cylinders which may be representative of light poles. According to embodiments, the server 215 may also extract, from the point cloud, any make, model number, and/or shape of any luminaire that may be depicted in the point cloud.

Figure 4A:
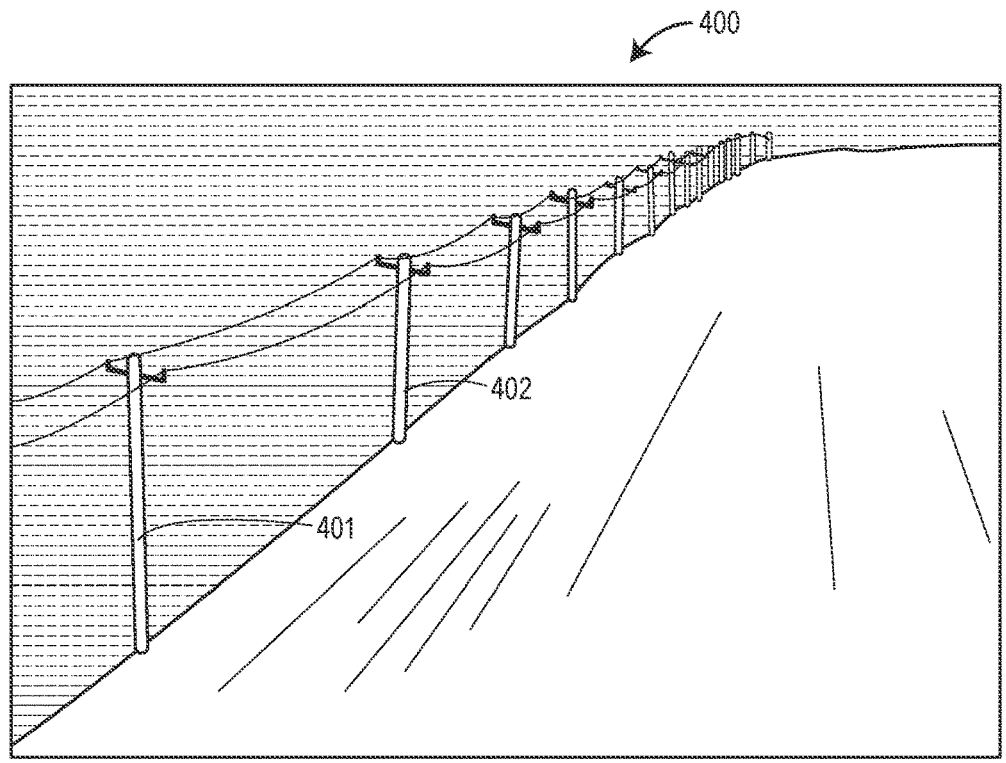
FIGS. 4A and 4B depict example scanning data used to identify light poles, in accordance with some embodiments.

FIG. 4A illustrates an example representation 400 of a point cloud generated using lidar data. As illustrated in the representation 400, the point cloud highlights light poles (including light poles 401, 402) which the server 215 may detect as vertical cylinders within the point cloud. According to embodiments, the server 215 may also detect, from the point cloud and/or from the lighting data, a set of luminaires on each of the light poles.

Figure 4B:
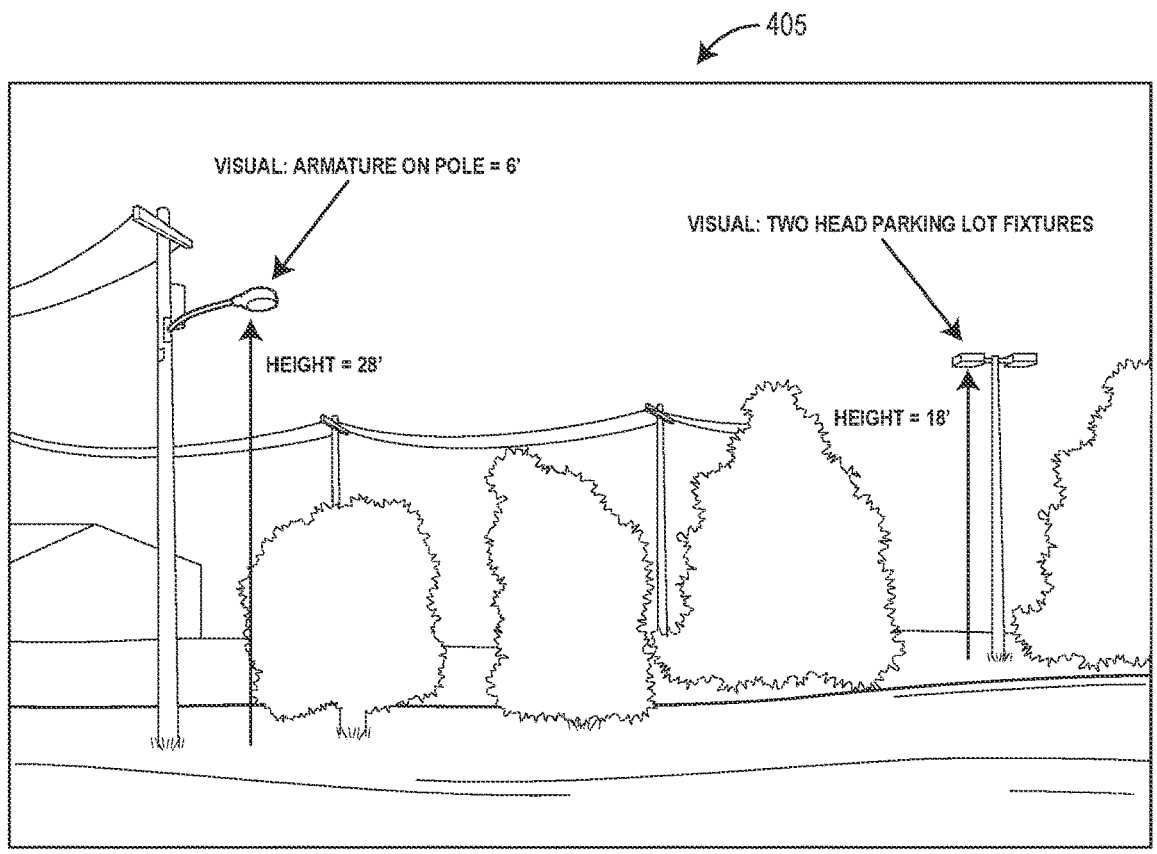

FIG. 4B illustrates another example representation 405 of a point cloud generated using lidar data. As illustrated in the representation 405, two (2) light poles are detected: a first with a height of twenty eight (28) feet with an armature on the pole of six (6) feet, and a second with a height of eighteen (18) feet with two head luminaire fixtures. According to embodiments, the server 215 may detect the light poles based on the heights of the light poles being at least a certain distance, and may detect armatures of light poles based on standard distances of armatures.

Generally, the length of an armature of a light pole may have an effect on the luminance level on the roadway and/or pathway. For example, if the armature of a light pole is too short, then the light from the luminaire on the armature may not adequately illuminate that portion of the roadway and/or pathway. Conversely, if the armature of a light pole is a proper distance, then the light from the luminaire on the armature may sufficiently illuminate that portion of the roadway and/or pathway.

Figure 5:
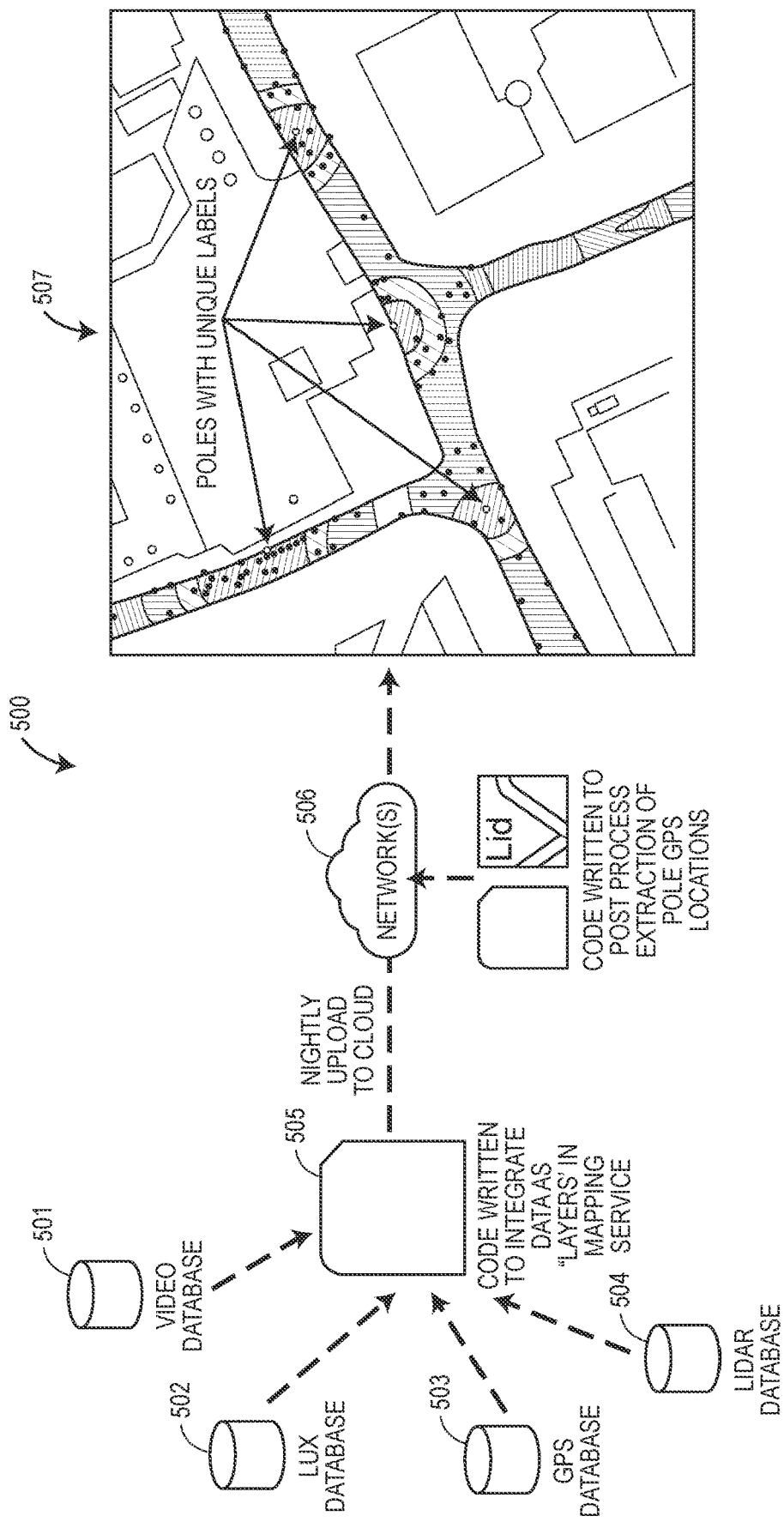
FIG. 5 depicts an example depiction of data compilation and upload, and a visualization generated from the data, in accordance with some embodiments.

The server 215 may generate (236) a set of visualizations associated with the collected and/or analyzed data. FIG. 5 illustrates a representation 500 of the consolidation and compiling of the data, and visualization generation corresponding thereto. In particular, FIG. 5 depicts the following datasets: video data 501 (i.e., any imaging data captured by an image sensor or similar component), lux data 502 (i.e., any luminance data captured by the lighting measurement device 207), GPS data 503 (i.e., any location data captured by a location module such as the location data device 205), and lidar data 504 (i.e., any scanning and/or lidar data captured by the scanning data device 208).

Reference 505 in FIG. 5 represents the datasets 501, 502, 503, 504 being integrated as layers in a mapping service. It should be appreciated that the server 215 or another component (e.g., such as an electronic device local to the data capturing components) may implement computer-executable instructions or code to integrate the datasets 501, 502, 503, 504. The integrated data represented by 505 may be uploaded at periodic intervals to the server 215, as represented by 506 in FIG. 5. As discussed herein, the server 215 may analyze the integrated data 505 to, among other purposes, extract light poles and associate locations with luminance measurements and locations of light poles.

According to embodiments, the integrated data 505 may include, for each extracted or detected light pole, a location (e.g., latitude and longitude coordinates, or a representation in x/y coordinates) for the light pole, a height of the light pole with and/or without an armature, a length of any armature, a height of any luminaire incorporated into the light pole, an image of the luminaire (e.g., to determine how many fixtures per light pole), a set of luminance measurements including a maximum measured, minimum maintained, degree of uniformity, and/or average, a luminance map associated with the light pole, a time(s) that any data was captured or recorded, and/or scanning data for the light pole, including a set of images, video, and/or lidar data.

FIG. 5 further depicts an example visualization 507 of a set of roadways and/or pathways that the server 215 may generate based on the data analysis. As depicted in FIG. 5, the visualization 507 may be represented as a heat map that color codes luminance levels at different roadway and/or pathway locations, where different ranges of luminance levels may be represented by different colors or shades of colors. Additionally, the visualization 507 may indicate locations of light poles (e.g., as represented by white circles).

According to embodiments, a user may review and interact with the visualization 507 via an electronic device, such as an electronic device executing an application and communicatively interfaced with the server 215. In particular, a user interface of an electronic device may display the visualization 507, where the user may interact and make selections associated with the visualization 507 via the user interface. For example, if the user selects a representation of a light pole, the user interface may display an image of the light pole and/or a luminaire of the light pole, such as an image captured by an image sensor. Additionally or alternatively, if the user selects a given luminance level, the user interface may display image, video data, and/or scanning data (e.g., a lidar point cloud) that was captured at that particular location.

Generally, the server 215 may generate any reports, dashboards, and/or the like that include or indicate relevant information associated with the compiling and analysis of the data. For example, the visualization 507 may represent a subset of data captured for a set of roadways and/or pathways across a specific municipality, area, city, town, county, or the like. Accordingly, the user may use the electronic device to zoom in, zoom out, pan, or other interactions to review and interact with different roadways and/or pathways for which data was captured. Additionally, the user may select different reports or features of the reports.

Figure 6:
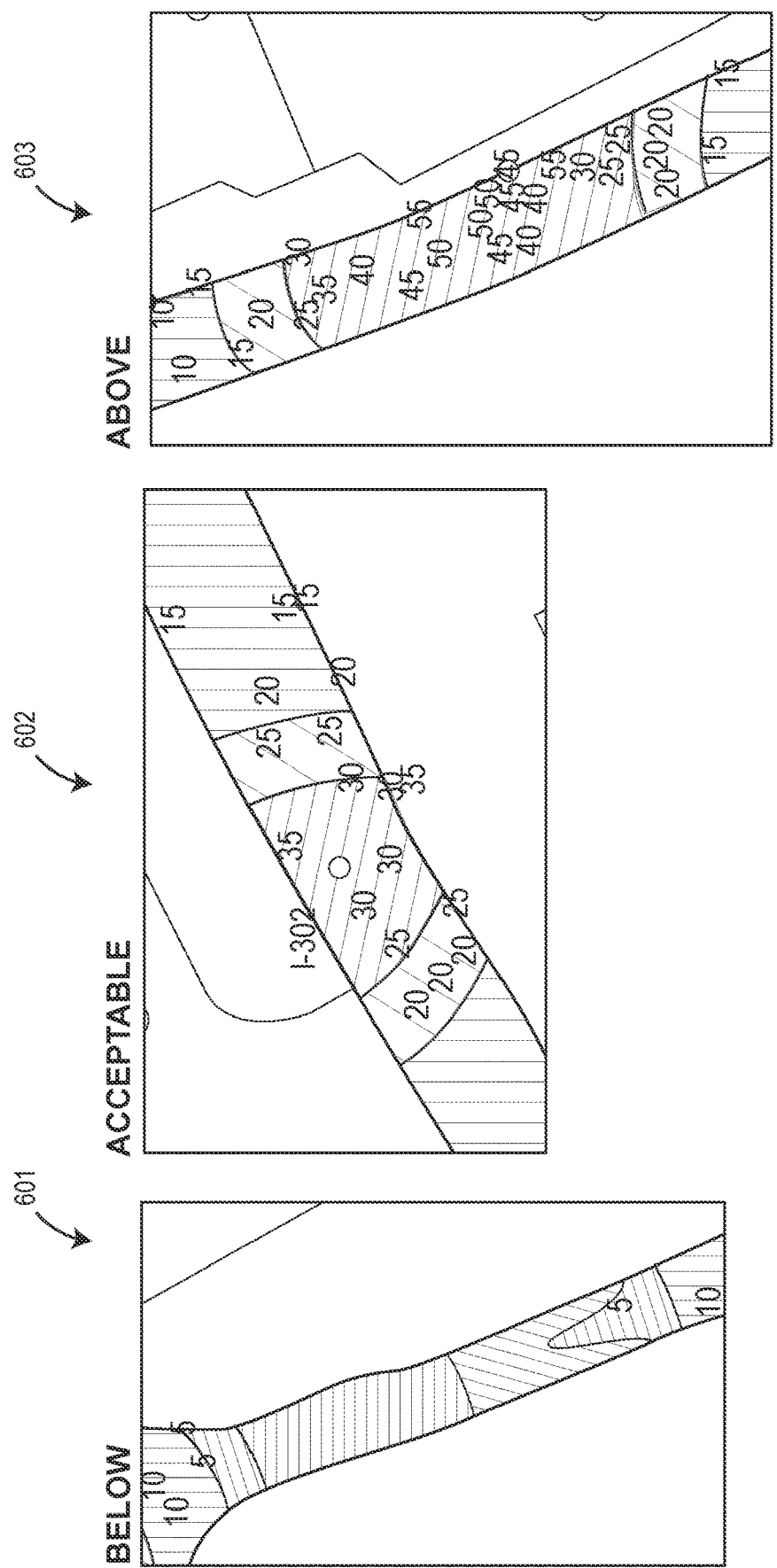
FIG. 6 depicts example lighting data visualizations, in accordance with some embodiments.

For example, FIG. 6 depicts different roadways and/or pathways for a given municipality or area, where the municipality may specify goal or target ranges for luminance levels for its roadways and/or pathways. For example, a municipality may set a range of 25-35 lux as its goal range, where a given report or visualization may rate fixtures and/or sections of roadways and/or pathways appropriately. For example, FIG. 6 depicts a roadway and/or pathway section 601 having luminance values that do not meet the specified goal range, a roadway and/or pathway section 602 having luminance values that do meet the specified goal range (or are otherwise considered acceptable), and a roadway and/or pathway section 603 having luminance values that are above the specified goal range.

In the signal diagram 200 of FIG. 2, the server 215 may additionally enable (238) user modifications. According to embodiments, the user modifications may be made to any reports or visualizations, as well as to any designs or software applications that modify designs.

Figure 7:
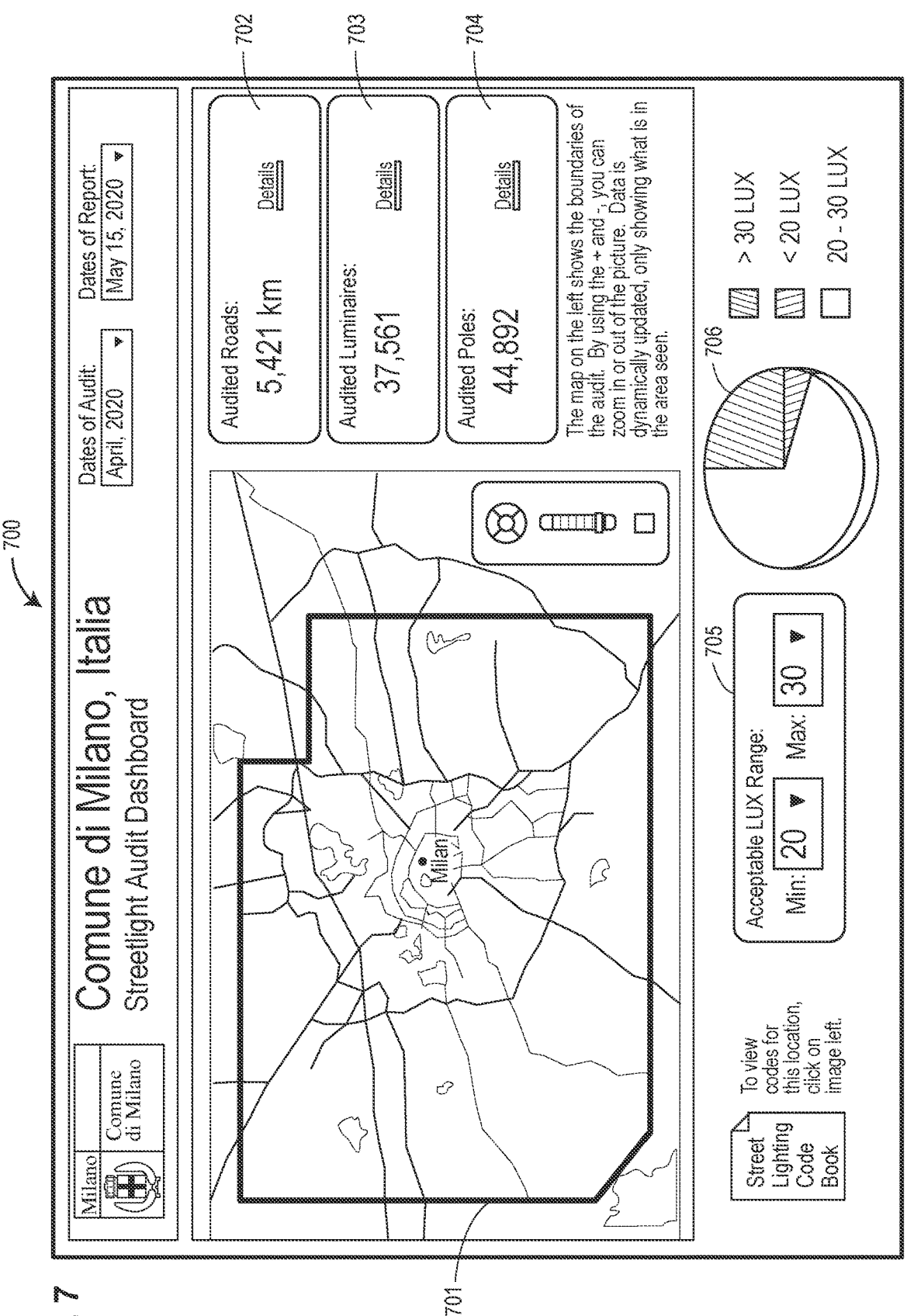
FIG. 7 depicts an example dashboard and report associated with a roadway or pathway lighting system, in accordance with some embodiments.

FIG. 7 depicts an example dashboard or report 700 that the server 215 may prepare for a user associated with a given municipality (e.g., which for the report 700 as depicted, is Milan, Italy). The dashboard 700 may include a map 701 of the municipality or a portion of the municipality, where the map 701 may include a boundary containing any audited roadways and/or pathways. Further, the dashboard 700 may indicate a length of audited roadways and/or pathways (702), an amount of audited luminaires (703), and an amount of audited light poles (704).

Additionally, the dashboard 700 may depict a selection area 705 in which the user may select a range of acceptable luminance values (as shown: between 20 and 30 lux). A chart 706 may dynamically update based on the selected range as well as the recorded luminance values. In the example depicted in FIG. 7, approximately a quarter of the roadway and/or pathway area exceeds 30 lux, about two-thirds of the roadway and/or pathway area is within the 20-30 lux range, and the remainder of the roadway and/or pathway area does not meet 20 lux.

According to embodiments, a user may interact with the map 701, such as to zoom in, zoom out, and pan. Based on the displayed area that results from the user interaction of the map 701, the information 702, 703, 704, 706 may dynamically update based on the collected and analyzed data for the displayed area. For example, if the user zoomed in on a particular neighborhood of Milan, the information 702, 703, 704, 706 dynamically updates based on the roadway and/or pathway, light pole, and luminance data for that particular neighborhood. Certain settings, data, outputs, information, and reports may be saved, printed, communicated (e.g., emailed), and/or the like. Likewise, if the user selects an area of the map 701 using a bounding box, the data from the selected area may be calculated and reported.

According to embodiments, the compiled and/or analyzed data may be imported into a design application (e.g., a CAD application) that may virtually depict the roadway(s) and/or pathway(s) and the corresponding illuminance values, the detected light poles, and/or other information. The design application may enable a user to "enter" the virtual space using a virtual reality (VR) or augmented reality (AR) goggle/headset. The view of the virtual space may be further enhanced with data drawn from the calculations in order to depict the luminance values for given light poles. Additionally, the user may use the design application to add and/or remove light poles, where the design application may dynamically calculate changes to luminance values in response to the addition and/or removal of light poles. Further, the user may use the design application to adjust the height, armature length, and/or luminaire configuration for a given light pole, where the design application may dynamically calculate changes to luminance values in response to the adjustments.

Further, the design application may dynamically update renderings or virtual depictions of roadways and/or pathways and luminance values related thereto, in response to the user adding and/or removing light poles, or otherwise making adjustments. In this regard, the user is afforded the benefit of viewing a simulated lighting environment for a particular roadway(s) and/or pathway(s) to make adjustments, changes, and the like, such as in an effort to upgrade and/or modify the real-world lighting for that particular roadway(s) and/or pathway(s).

Figure 8:
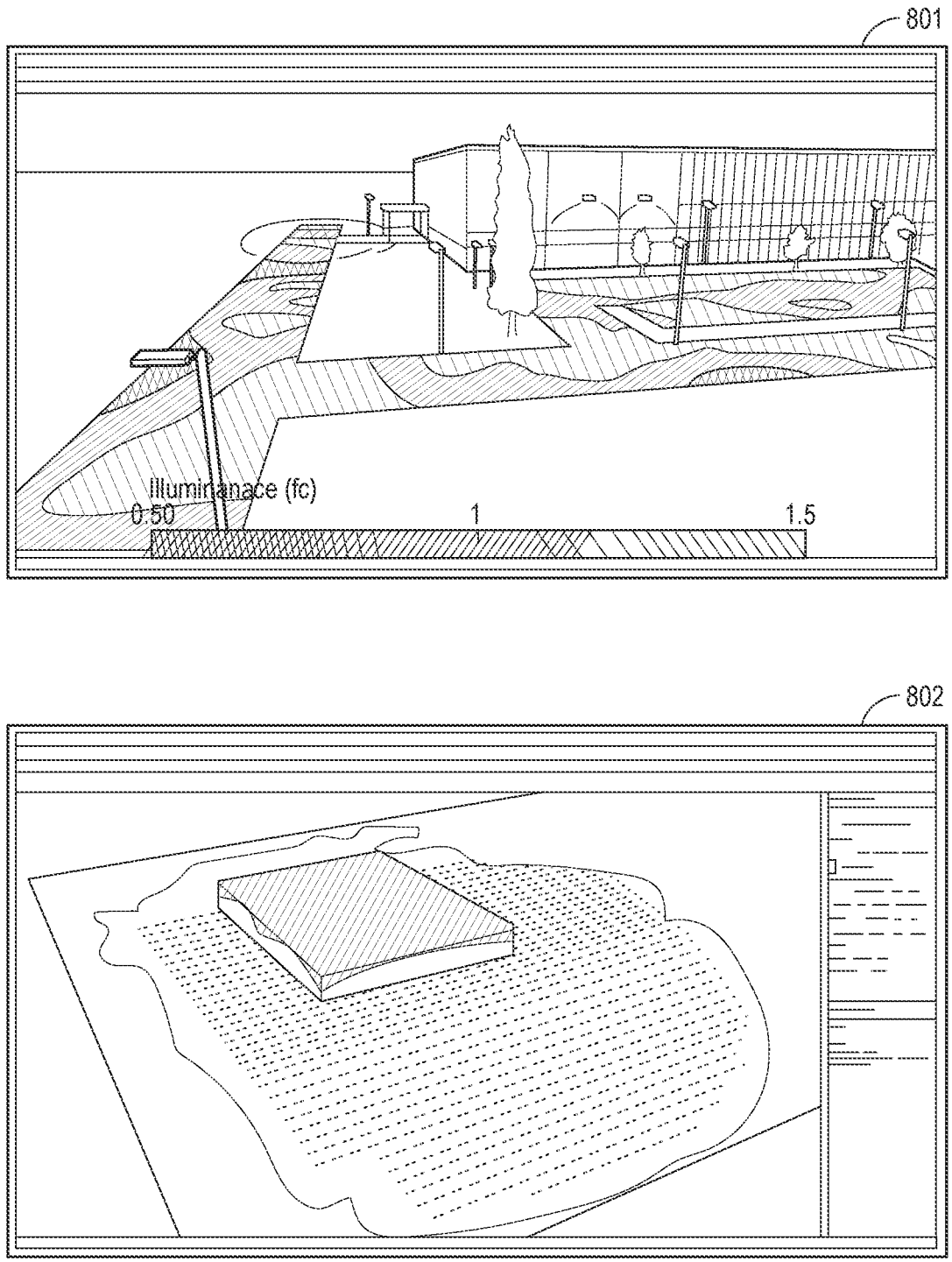
FIG. 8 depicts example visualizations associated with lighting systems, in accordance with some embodiments.

FIG. 8 illustrates exemplary renderings of lighting measurements associated with different roadways and/or pathways. In particular, a rendering 801 depicts a heat map of luminance values for certain portions of roadways and/or pathways, and a rendering 802 depicts a simulated rendering of a parking lot and its associated light created by luminaires present in the parking lot.

In the signal diagram 200 of FIG. 2, the server 215 may additionally employ (240) certain machine learning aspects. Generally, the server 215 and/or any interfacing electronic devices may employ various machine learning and artificial intelligence techniques such as, for example, a regression analysis (e.g., a logistic regression, linear regression, random forest regression, probit regression, or polynomial regression), classification analysis, k-nearest neighbors, decisions trees, random forests, boosting, neural networks, support vector machines, deep learning, reinforcement learning, Bayesian networks, or the like.

In certain implementations after the analysis of (234) is performed and light poles are detected by the server 215, a user may review the results as well as any corresponding images to confirm whether a light pole is actually present where the server 215 detects a light pole (i.e., to reduce instances of false positives). Additionally, the user may identify the presence of a light pole where the server 215 does not detect a light pole (i.e., to reduce instances of false negatives).

The user may use an electronic device (e.g., the electronic devices 116, 117 as discussed with respect to FIG. 1) to make appropriate selections related to the presence and absence of light poles, where these selections may represent training data that may be used to train a machine learning model. In embodiments, the user may additionally or alternatively make selections related to whether a bright spot departs the video data up and to the right or to the left (as discussed with respect to FIG. 3). When the devices 207, 208, 209 subsequently capture additional data (as described with respect to 220, 222, 224) and the server 215 analyzes this data (as described with respect to 232, 234), the server 215 may input the additional data into the trained machine learning model, which may output a set of data that indicates a set of light poles and their respective locations. The user may additionally analyze this output data to make any corrections (i.e., identify false negatives and false positives), the data from which may be used to additionally train or refine the machine learning model. Thus, the machine learning model may be consistently updated so that output accuracy is consistently improved.

In other implementations, the server 215 may employ machine learning techniques to define areas of roadways and/or pathways to be analyzed. In some conventional implementations, an electronic device may enable a user to define, using captured data, areas of the roadway and/or pathway to be analyzed. According to the described embodiments, the server 215 may analyze captured scanning data (e.g., lidar data) to automatically define areas of the roadway and/or pathway to be analyzed. In particular, point clouds resulting from lidar data enable accurate measures of up to sixty (60) meters in front of the vehicle, from which curves and hills may be calculated and from which the areas of the road to be analyzed may be defined, such as defining rectangles of a roadway and/or pathway.

The user may use an electronic device (e.g., the electronic devices 116, 117 as discussed with respect to FIG. 1) to confirm the accuracy of the defined areas of roadway and/or pathway, make any corrections or adjustments, and make other selections, where these selections may represent training data that may be used to train an additional machine learning model. When the devices 207, 208, 209 subsequently capture additional data (as described with respect to 220, 222, 224) and the server 215 analyzes this data to define areas of roadway and/or pathway, the server 215 may input the additional data into the trained additional machine learning model, which may output a set of data that indicates areas of roadway and/or pathway to be analyzed. The user may additionally analyze this output data to make any corrections, the data from which may be used to additionally train or refine the machine learning model. Thus, the additional machine learning model may be consistently updated so that output accuracy is consistently improved. Generally, an output of a machine learning model may indicate where data creates any concerns for a user or customer, where the output may recommend that there are areas of "likely concern" and direct the user to select an alert to view the relevant data.

According to embodiments, machine learning techniques may be employed in other aspects. In particular, one or more machine learning models may be used to generate point clouds from lidar data and detect light poles from the point clouds. Further, one or more machine learning models may be used to detect armature length of light poles, as well as alert users in situations of low (i.e., below a threshold) lighting levels as well as improper or sub-optimal light pole armature length.

Additionally, one or more machine learning models may be used in response to a user making design modifications to a roadway or pathway illuminance. In particular, the machine learning model may be updated to reflect any design modifications, and may automatically identify similar areas of roadway and/or pathway that may benefit from similar modifications, and may present or communicate these identified areas to a user for potential modification.

According to embodiments, the systems and methods may support one or more applications (e.g., executable by the server 215) that may generate, present, and communicate certain information to users such as field engineers. In particular, an application may identify all roadways and/or pathways that are included in a project (e.g., as set by a user or customer), and depict or indicate the roadways and/or pathways in a map. Further, the application may determine which roadways or pathways have already been traversed and/or captured, and display or indicate any remaining roadways or pathways in the project that still need to be traversed and/or captured. Additionally, the application may indicate the distance (e.g., in miles or kilometers) of the traversed and/or captured roadways or pathways, as well as the distance of any roadways or pathways that have not been traversed and/or captured.

Figure 9:
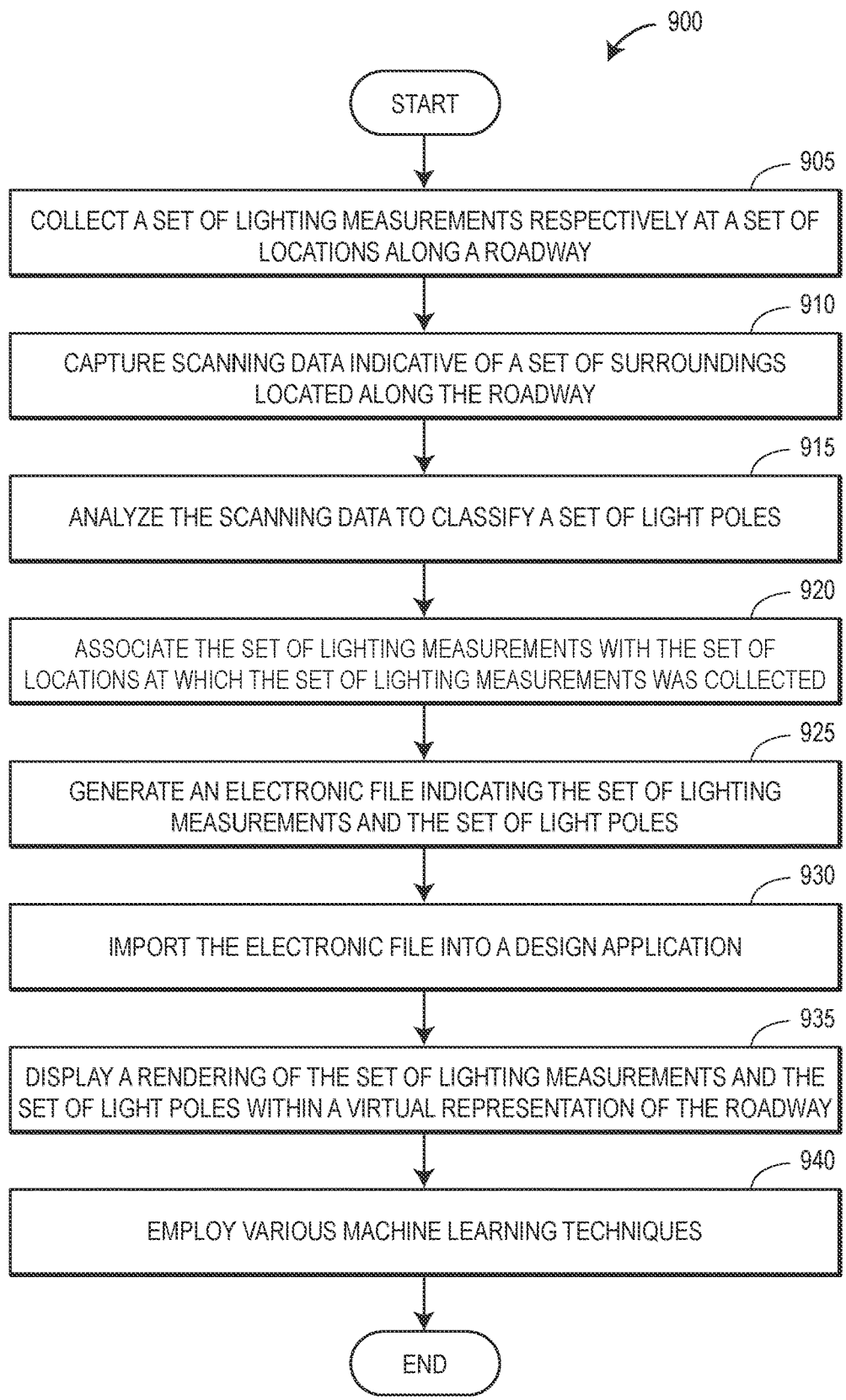
FIG. 9 is an example flowchart of a method for detecting roadway or pathway lighting conditions, in accordance with some embodiments.

FIG. 9 is a flowchart of a method for detecting roadway and/or pathway lighting conditions. The method 900 may be executed or implemented by one or more electronic devices and components thereof.

The method 900 begins when a meter device collects (block 905) a set of lighting measurements respectively at a set of locations along a roadway and/or pathway. According to embodiments, the meter device may collect a set of luminance measurements or values respectively at the set of locations along the roadway and/or pathway.

At block 910, a detector device may capture scanning data indicative of a set of surroundings located along the roadway and/or pathway. According to embodiments, the detector device may be a device having a lidar sensor configured to emit a set of pulses in a vicinity of the lidar sensor, and detect at least a portion of the set of pulses that reflect off a set of objects in the vicinity of the lidar sensor. According to other embodiments, the detector device may be an image sensor configured to capture a set of images depicting the set of surroundings located along the roadway and/or pathway.

At block 915, a server or other electronic device may analyze the scanning data to classify a set of light poles. According to embodiments in which the scanning data is lidar data, the server or other electronic device may generate a point cloud from at least the portion of the set of pulses that was detected, detect, from the point cloud, a set of shapes each resembling a light pole, and classify the set of shapes as the set of light poles.

At block 920, the server or other electronic device may associate the set of lighting measurements with the set of locations at which the set of lighting measurements was collected. Further, at block 925, the server or other electronic device may generate an electronic file indicating the set of lighting measurements and the set of light poles. In some embodiments, the devices that capture the data may compile the data, generate the electronic file, and send the electronic file to the server or other electronic device.

At block 930, the server or other electronic device may import the electronic file into a design application. Further, at block 935, the server or electronic device may, via a user interface of the design application, display a rendering of the set of lighting measurements and the set of light poles within a virtual representation of the roadway and/or pathway. Further, in embodiments, the server or other electronic device (e.g., using the design application) may convert at least a portion of the lighting measurements into a heat map indicating a goal attainment and depicting a set of colors according to the goal attainment. Additionally, the server or electronic device (e.g., using the design application) may receive a selection of a light pole of the set of light poles, and display, within the user interface, a rendering of the light pole and an indication of a lighting measurement associated with the light pole.

Further, in embodiments, the roadway and/or pathway may be included as part of a municipality or other defined government, territory, or the like, where the server or other electronic device may compile lighting data associated with a plurality of additional roadways and/or pathways of the municipality, and display, in a user interface, information indicative of the lighting data that was compiled. According to embodiments, the information indicative of the lighting data may include an indication of an amount of roadways and/or pathways, an amount of luminaires, an amount of light poles, and/or a percentage of the light poles that are within an acceptable illuminance range.

At block 940, the server or other electronic device may employ various machine learning techniques. According to some embodiments, a user may review data associated with the set of light poles that were classified by the server or other electronic device to confirm or correct the light pole classifications. The resulting data may represent training data to train a machine learning model, which may be used by the server or other electronic device for subsequent analyses of input data to identify light poles for a given roadway and/or pathway. According to other embodiments, a user may review data associated with defining areas of roadway(s) and/or pathway(s) to be analyzed to confirm or correct the defined areas. The resulting data may represent training data to train a machine learning model, which may be used by the server or other electronic device for subsequent analyses of input data to define areas of roadway(s) and/or pathway(s) to be analyzed.

Figure 10:
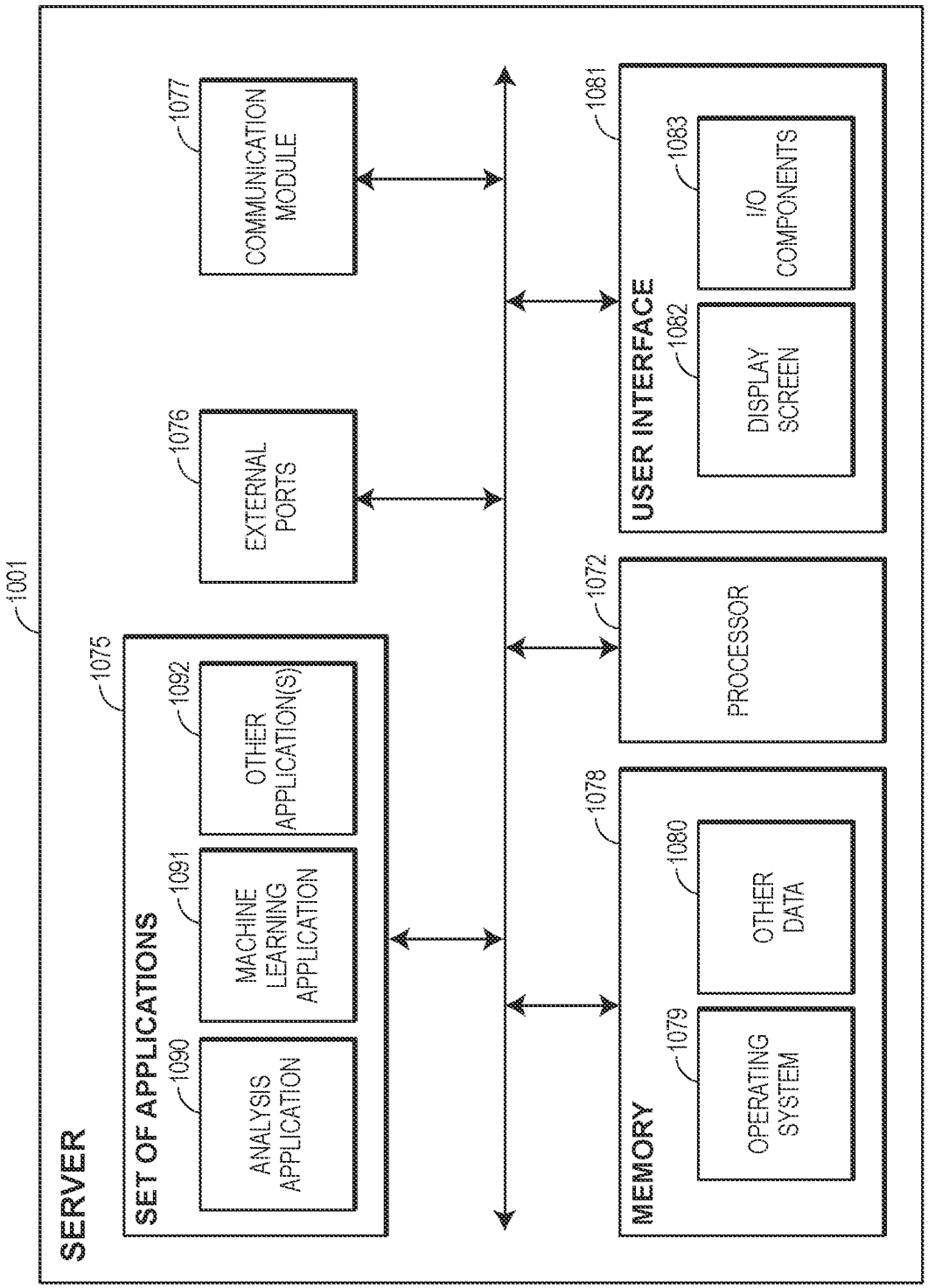
FIG. 10 is a block diagram of an example server, in accordance with some embodiments.

FIG. 10 illustrates a hardware diagram of an example server 1001 (e.g., the server 115 or 215 as described with respect to FIGS. 1 and 2), in which the functionalities as discussed herein may be implemented. It should be appreciated that the components of the server 1001 may also be present, in whole or in part, in any of the devices 107, 108, 109, 116, and 117 as described with respect to FIG. 1.

The server 1001 may include a processor 1072 as well as a memory 1078. The memory 1078 may store an operating system 1079 capable of facilitating the functionalities as discussed herein as well as a set of applications 1075 (i.e., machine readable instructions). For example, one of the set of applications 1075 may be an analysis application 1090 configured to analyze data that is collected and compiled, and associated with a given roadway(s) and/or pathway(s). For further example, one of the set of applications 1075 may be a machine learning application 1091 configured to facilitate the various machine learning functionalities as described herein. It should be appreciated that one or more other applications 1092 are envisioned.

The processor 1072 may interface with the memory 1078 to execute the operating system 1079 and the set of applications 1075. According to some embodiments, the memory 1078 may also store other data 1080 that may include any roadway and/or pathway data that is collected and compiled, as well as any data associated with a machine learning model(s). The memory 1078 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The server 1001 may further include a communication module 1077 configured to communicate data via one or more networks 1010. According to some embodiments, the communication module 1077 may include one or more transceivers (e.g., WAN, WWAN, WLAN, and/or WPAN transceivers) functioning in accordance with IEEE standards, 3GPP standards, or other standards, and configured to receive and transmit data via one or more external ports 1076.

The server 1001 may further include a user interface 1081 configured to present information to a user and/or receive inputs from the user. As shown in FIG. 10, the user interface 1081 may include a display screen 1082 and I/O components 1083 (e.g., ports, capacitive or resistive touch sensitive input panels, keys, buttons, lights, LEDs, and/or built in or external keyboard). Additionally, although not shown in FIG. 10, the server 1001 may include a speaker configured to output audio data, a microphone configured to detect audio, and various sensors such as, for example, a location module (e.g., a GPS chip), an image sensor, an accelerometer, a clock, a gyroscope (i.e., an angular rate sensor), a compass, a yaw rate sensor, a tilt sensor, telematics sensors, and/or other sensors.

In some embodiments, the server 1001 may perform the functionalities as discussed herein as part of a "cloud" network or may otherwise communicate with other hardware or software components within the cloud to send, retrieve, or otherwise analyze data.

In general, a computer program product in accordance with an embodiment includes a computer usable storage medium (e.g., standard random access memory (RAM), an optical disc, a universal serial bus (USB) drive, or the like) having computer-readable program code embodied therein, wherein the computer-readable program code is adapted to be executed by the processor 1072 (e.g., working in connection with the operating system 1079) to facilitate the functions as described herein. In this regard, the program code may be implemented in any desired language, and may be implemented as machine code, assembly code, byte code, interpretable source code or the like (e.g., via C, C++, Java, Actionscript, Objective-C, Javascript, CSS, XML, and/or others).

Although the following text sets forth a detailed description of numerous different embodiments, it should be understood that the legal scope of the invention may be defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a non-transitory, machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that may be permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that may be temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it may be communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment, or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment.

As used herein, the terms "comprises," "comprising," "may include," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also may include the plural unless it is obvious that it is meant otherwise.

This detailed description is to be construed as examples and does not describe every possible embodiment, as describing every possible embodiment would be impractical.

What is claimed is:

1. A computer-implemented method for detecting roadway or pathway lighting conditions, the method comprising:
as a movable object is traveling on a roadway or pathway:
collecting, by a meter device disposed on a set of connected parts of a device configured to mount to the movable object, a set of lighting measurements respectively at a set of locations along the roadway or pathway, and
capturing, by an image sensor disposed on the set of connected parts, video data indicative of a set of surroundings located along the roadway or pathway;
analyzing, by a processor, the video data to:
detect a set of spots each having a brightness that at least meets a threshold value, and
for each of the set of spots, determine, based on a direction in which the video data depicts the spot departing from a field of view of the image sensor, a side of the roadway or pathway on which the corresponding spot is located;
classifying, by the processor, the set of spots each having the brightness that at least meets the threshold value as a set of light poles respectively located at a portion of the set of locations along the roadway or pathway, wherein each of the set of light poles is located on the side of the roadway or pathway on which the corresponding spot is located;

associating, by the processor, the set of lighting measurements with the set of locations at which the set of lighting measurements was collected;

displaying, within a user interface of a design application, a rendering of the roadway or pathway, the rendering comprising (i) a first section of the roadway or pathway having a first portion of the set of lighting measurements that is below a specified goal range, (ii) a second section of the roadway of pathway having a second portion of the set of lighting measurements that meets the specified goal range, (iii) a third section of the roadway or pathway having a third portion of the set of lighting measurements that is above the specified goal range, and (iv) the set of light poles classified at the portion of the set of locations, wherein the rendering indicates the first portion of the set of lighting measurements, the second portion of the set of lighting measurements, and the third portion of the set of lighting measurements;

receiving, via the user interface, a selection to add or remove at least one light pole of the set of light poles;

based on the selection to add or remove the at least one light pole, dynamically calculating a set of changes to at least a portion of the set of lighting measurements; and dynamically updating, within the user interface, the rendering of the roadway or pathway to indicate (i) the set of changes to at least the portion of the set of lighting measurements, and (ii) the set of light poles with the at least one light pole added or removed.

2. The computer-implemented method of claim 1, wherein collecting the set of lighting measurements comprises:

collecting, by the meter device, a set of luminance measurements respectively at the set of locations along the roadway or pathway.

3. The computer-implemented method of claim 1, further comprising:

converting at least a portion of the lighting measurements into a heat map depicting a set of colors corresponding to a set of luminance levels.

4. The computer-implemented method of claim 1, further comprising:

receiving, via the user interface, a selection of a light pole of the set of light poles; and displaying, within the user interface, a rendering of the light pole and an indication of a lighting measurement associated with the light pole.

5. The computer-implemented method of claim 1, wherein the roadway or pathway is included as part of a municipality, and wherein the method further comprises:

compiling lighting data associated with a plurality of additional roadways or pathways of the municipality; and displaying, in the user interface, information indicative of the lighting data that was compiled.

6. The computer-implemented method of claim 5, wherein displaying the information indicative of the lighting data comprises:

displaying, in the user interface, an indication of an amount of roadways or pathways, an amount of luminaires, and an amount of light poles.

7. A system to detect roadway or pathway lighting conditions, comprising:

a device configured to mount to a movable object and comprising a set of connected parts;

a meter device disposed on the set of connected parts and configured to, while the movable object is traveling on a roadway or pathway, collect a set of lighting measurements;

an image sensor disposed on the set of connected parts and configured to, while the movable object is traveling on a roadway or pathway, capture video data; and a processor configured to:

access the set of lighting measurements collected by the meter device, the set of lighting measurements respectively collected at a set of locations along the roadway or pathway, access the video data captured by the image sensor, the video data indicative of a set of surroundings located along the roadway or pathway, analyze the video data to:

detect a set of spots each having a brightness that at least meets a threshold value, and for each of the set of spots, determine, based on a direction in which the video data depicts the spot departing from a field of view of the image sensor, a side of the roadway or pathway on which the corresponding spot is located, classify the set of spots each having the brightness that at least meets the threshold value as a set of light poles respectively located at a portion of the set of locations along the roadway or pathway, wherein each of the set of light poles is located on the side of the roadway or pathway on which the corresponding spot is located, associate the set of lighting measurements with the set of locations at which the set of lighting measurements was collected, display, within a user interface of a design application, a rendering of the roadway or pathway, the rendering comprising (i) a first section of the roadway or pathway having a first portion of the set of lighting measurements that is below a specified goal range, (ii) a second section of the roadway of pathway having a second portion of the set of lighting measurements that meets the specified goal range, (iii) a third section of the roadway or pathway having a third portion of the set of lighting measurements that is above the specified goal range, and (iv) the set of light poles classified at the portion of the set of locations, wherein the rendering indicates the first portion of the set of lighting measurements, the second portion of the set of lighting measurements, and the third portion of the set of lighting measurements, receive, via the user interface, a selection to add or remove at least one light pole of the set of light poles, based on the selection to add or remove the at least one light pole, dynamically calculate a set of changes to at least a portion of the set of lighting measurements; and dynamically update, within the user interface the rendering of the roadway or pathway to indicate (i) the set of changes to at least the portion of the set of lighting measurements, and (ii) the set of light poles with the at least one light pole added or removed.

8. The system of claim 7, wherein the meter devices collects a set of luminance measurements respectively at the set of locations along the roadway or pathway.

9. The system of claim 7, wherein the processor is further configured to:
convert at least a portion of the lighting measurements into a heat map depicting a set of colors corresponding to a set of luminance levels.

10. The system of claim 7, wherein the processor is further configured to:
receive, via the user interface, a selection of a light pole of the set of light poles, and
cause the user interface to display a rendering of the light pole and an indication of a lighting measurement associated with the light pole.

11. The system of claim 7, wherein the roadway or pathway is included as part of a municipality, and wherein the processor is further configured to:
compile lighting data associated with a plurality of additional roadway or pathways of the municipality, and
display, in the user interface, information indicative of the lighting data that was compiled.

12. The system of claim 11, wherein the information displayed in the user interface comprises an indication of an amount of roadway or pathways, an amount of luminaires, and an amount of light poles.

* * * * *